United States Patent [19]

Chance et al.

[11] Patent Number: 4,584,441
[45] Date of Patent: Apr. 22, 1986

[54] BIDIRECTIONAL ADAPTIVE VOICE FREQUENCY REPEATER

[75] Inventors: Christopher P. Chance, Winston-Salem; Ralph P. Coble, Jr., Greensboro; Edwin C. Ingle, Jamestown; Joye A. Jones, Greensboro, all of N.C.

[73] Assignee: AT&T Bell Laboratories, Murray Hill, N.J.

[21] Appl. No.: 648,326

[22] Filed: Sep. 7, 1984

[51] Int. Cl.$^4$ ............................................. H04B 3/20
[52] U.S. Cl. ............................. 179/170.2; 179/170 R
[58] Field of Search ............. 179/170 R, 170.2, 170.6, 179/170.8, 18 FA

[56] References Cited

U.S. PATENT DOCUMENTS

| | | | |
|---|---|---|---|
| 1,553,435 | 9/1925 | Chapman et al. | 179/170.2 |
| 2,164,752 | 7/1939 | Nyquist | 179/170.2 |
| 2,254,733 | 9/1941 | Dickieson | 179/170.2 |
| 3,499,999 | 3/1970 | Sondhi | 179/170.2 |
| 3,500,000 | 3/1970 | Kelly et al. | 179/170.2 |
| 4,133,982 | 1/1979 | Lee et al. | 179/18 AH |
| 4,175,218 | 11/1979 | Ayano et al. | 179/170.2 |
| 4,405,840 | 9/1983 | Zebo | 179/170.2 |
| 4,426,729 | 1/1984 | Gritton | 381/41 |
| 4,491,701 | 1/1985 | Duttweiler et al. | 179/170.2 |

FOREIGN PATENT DOCUMENTS

| | | | |
|---|---|---|---|
| 2008903 | 6/1979 | United Kingdom | 179/170.2 |
| 1563742 | 3/1980 | United Kingdom | |

OTHER PUBLICATIONS

G. P. Eckley et al., "Digital Signal Solves Hybrid Balance Puzzle", *Telephone Engineer & Management*, Aug. 1, 1983, pp. 39-46.

D. L. Duttweiler, "Bell's Echo-Killer Chip", *IEEE Spectrum*, Oct. 1980, pp. 34-37.

Primary Examiner—Gene Z. Rubinson
Assistant Examiner—R. Vaas
Attorney, Agent, or Firm—Thomas Stafford

[57] ABSTRACT

A large signal detector is employed to detect large amplitude signals incoming to a bidirectional repeater. An output from the detector is supplied to echo cancelers in the repeater and is used to inhibit updating of the echo canceler impulse response characteristic during intervals that such large incoming signals are present.

12 Claims, 3 Drawing Figures

BIDIRECTIONAL ADAPTIVE VOICE FREQUENCY REPEATER

TECHNICAL FIELD

This invention relates to transmission networks and, more particularly, to bidirectional adaptive voice frequency repeaters.

BACKGROUND OF THE INVENTION

Adaptive voice frequency repeaters which employ echo cancelers to maximize return loss, or, stated another way, to minimize reflected signals, tend to be susceptible to spurious signals. These spurious signals may be ringing, dial pulses, lightning hits, power line crosses or other "large" amplitude signals having significant harmonic content.

Ringing signals, for example, are not necessarily "pure" sine waves. The ringing signal is nominally a 20 Hz signal and may be generated in numerous ways including harmonic generators, square wave generators or the like. Consequently, the ringing signal may have numerous large amplitude harmonics which fall within the voice frequency band, i.e., between 200 Hz and 3200 Hz. Similarly, the voltage waveform of dial pulses, which may range from 7.5 pulses per second (pps) to 12.5 pps, is also rich in harmonic content.

The echo cancelers used in voice frequency repeaters typically have a limited number of "taps", i.e., amplitude coefficients, to generate an impulse response characteristic which matches the echo path characteristic caused by a 2-wire bidirectional facility connected to the repeater. Because of the large amplitude harmonics in the ringing, dial pulses and other similar signals, the echo canceler tends to adapt to an undesirable impulse response characteristic which, in turn, does not necessarily result in the desired maximum return loss for the "normal" voice frequency signals, for example, voice and white noise.

SUMMARY OF THE INVENTION

The problems resulting from the "large" signals incoming to the repeater are overcome, in accordance with an aspect of the invention, by detecting the presence of such large signals and inhibiting updating the impulse response characteristic of the echo canceler(s) during the presence of such signals.

In one embodiment of the invention, a detector is employed that generates an inhibit signal when such signals incoming to the repeater are above a predetermined threshold value.

BRIEF DESCRIPTION OF THE DRAWING

The invention will be more fully understood from the following detailed description of an illustrative embodiment taken in connection with the appended figures in which.

DETAILED DESCRIPTION

Figure 1:
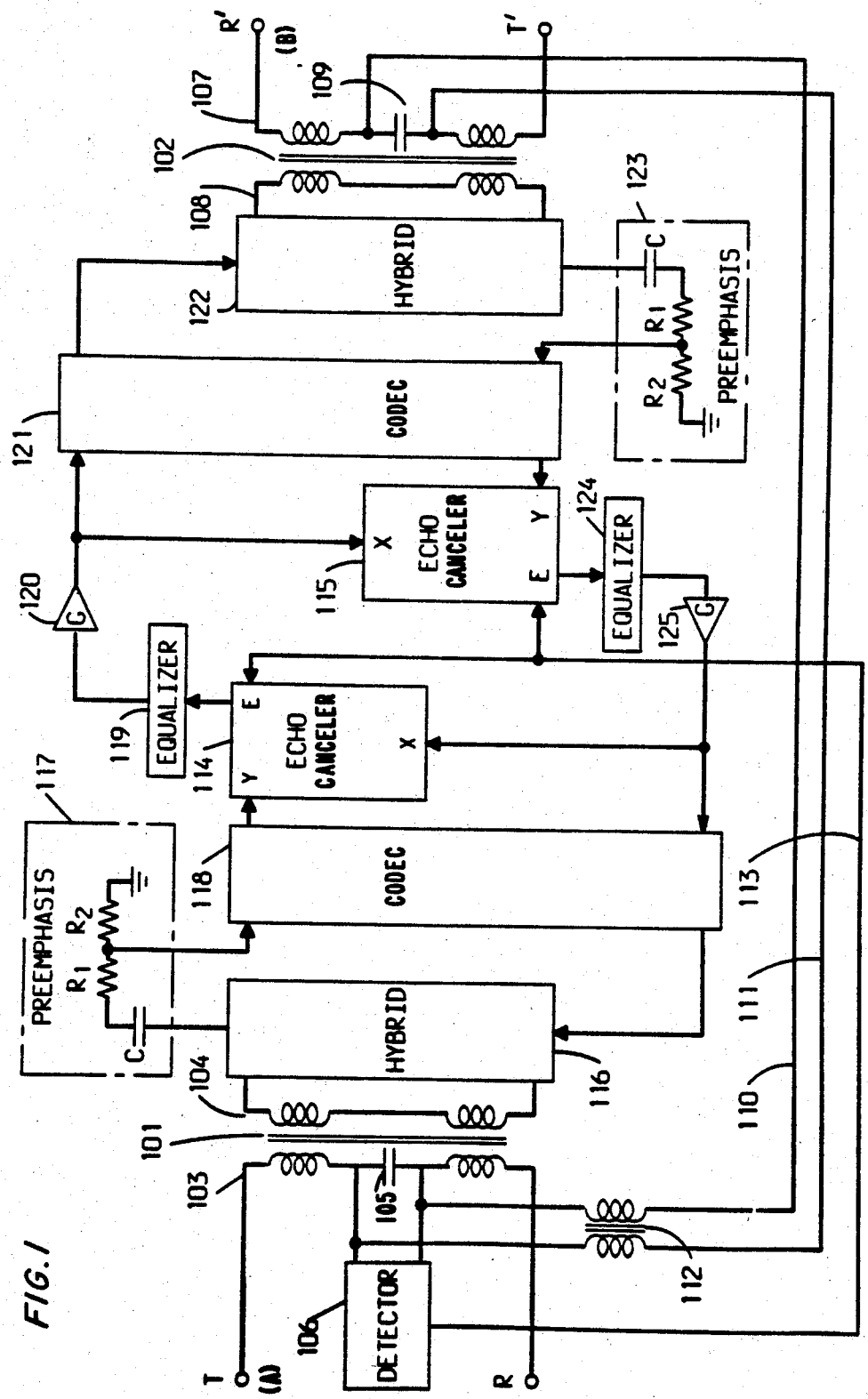
FIG. 1 shows in simplified block diagram form an adaptive voice band repeater including an embodiment of the invention.

FIG. 1 shows in simplified block diagram form an automatically adaptive voice frequency repeater including an embodiment of the invention. The repeater of FIG. 1 is intended to enhance voice frequency signals being transmitted on a 2-wire transmission path or facility.

Accordingly, shown in FIG. 1 are coupling transformers 101 and 102 which are adapted for connecting the subject repeater to bidirectional 2-wire transmission facilities A and B, respectively. Transformer 101 is adapted to connect bidirectional 2-wire facility A to the repeater via terminals T and R. Transformer 101 includes primary winding 103 and secondary winding 104. Winding 103 includes so-called midpoint capacitor 105 for extracting signaling information. Also developed across capacitor 105 are so-called "out-of-band" signals, for example, ringing, dial pulses and the like. Detector 106 is connected across midpoint capacitor 105 and is employed, in accordance with an aspect of the invention, to detect the presence of "large" out-of-band signals incoming to the subject repeater from either facility A or B. The connection of detector 106 in the repeater is important so that longitudinal balance of the repeater is not disturbed. It is also important to note that the "out-of-band" large signal be detected as such. This is because the low frequency components of the ringing signal, dial pulses and the like having significant energy may not be readily detected in the voice frequency band.

Transformer 102 also includes primary winding 107 and secondary winding 108. Winding 107 also includes midpoint capacitor 109. Transformer 102 is adapted to connect bidirectional 2-wire facility B to the repeater via terminals T' and R'.

Signaling information from facilities A and B are bypassed around the subject repeater via circuit connections 110 and 111 which include coils of inductor 112. Consequently, any ringing signals, dial pulses and the like from 2-wire facility B and developed across capacitor 109 are also supplied to detector 106. A control signal output from detector 106 indicating the presence of such "large" signals having amplitudes above a predetermined threshold value is supplied via circuit connection 113 to echo cancelers 114 and 115. As will be further explained below, echo cancelers 114 and 115 are responsive to the control signal from detector 106 to inhibit updating of the echo canceler impulse response characteristic, in accordance with the invention, during the presence of such "large" incoming signals.

"Large" is determined relative to the peak amplitude of the so-called normal voice frequency signals, i.e., voice, tones, multifrequency tones and similar signals. In this system the peak amplitude of such voice frequency signals is typically in the range of up to 5 volts maximum. Consequently, the large signal threshold in this example, not to be construed as limiting the scope of the invention, is set at approximately 20 volts peak. However, in other systems the large signal threshold may be set at a significantly lower peak amplitude depending on the amplitude range of the normal voice frequency signals.

First and second terminals of winding 104 are connected to hybrid network 116. Hybrid 116 may be any of the hybrid arrangements known in the art for coupling a 2-wire facility to a 4-wire facility. Preferably, hybrid 116 is of the electronic type. Hybrid network 122 is identical to hybrid network 116.

The incoming signal output from hybrid 116 is supplied to preemphasis circuit 117. Preemphasis circuit 117 includes a filter made up of capacitor C and resistors R1 and R2 and is employed to shape the lower frequency portion of the repeater input. As explained in our copending U.S. patent application Ser. No. 648,327, filed concurrently herewith, the low frequency, i.e., below 200 Hz, shaping of the repeater input signal frequency characteristic is important to minimize the number of taps required in each echo cancelers 114 and 115 in order to generate the desired impulse response characteristic for cancelling reflected signals in the voice frequency band, i.e., 200 Hz to 3200 Hz. Preemphasis circuit 123 is identical to preemphasis circuit 117. It is noted that the echo signal passes through both preemphasis circuits 117 and 123 and, consequently, the effective roll-off is doubled for the echo path signals for each direction of transmission.

An output from preemphasis circuit 117 is supplied to an encoder input of CODEC 118. The encoder of CODEC 118 converts the analog input signal into an 8-bit $\mu$-law PCM digital signal, in well-known fashion. The 8-bit digital signal from CODEC 118 is supplied to a Y input of echo canceler 114. Output E from echo canceler 114 is supplied via equalizer 119 and gain unit 120 to an X input of echo canceler 115 and to a decoder input of CODEC 121. The decoder of CODEC 121 converts the 8-bit $\mu$-law PCM output from echo canceler 114 into an analog output signal, in well-known fashion. The analog output from CODEC 121 is supplied to hybrid 122 and, in turn, via transformer 102 to bidirectional 2-wire facility B.

Echo canceler 114 is employed to cancel the echo signal or reflected signal resulting in the signal transmission from bidirectional 2-wire facility A because of the signal incoming to the repeater from bidirectional 2-wire facility B. Similarly, echo canceler 115 is employed to cancel the echo or reflected signal resulting in the signal transmission from bidirectional 2-wire facility B because of the signal incoming to the repeater from bidirectional facility A. Details of an echo canceler which may be employed for cancelers 114 and 115 are shown in FIG. 2 and described below.

An analog signal from bidirectional 2-wire facility B is supplied via transformer 102, hybrid 122 and preemphasis circuit 123 to an encoder input of CODEC 121. In turn, CODEC 121 converts the analog input signal into a digital $\mu$-law signal which is supplied to the Y input of echo canceler 115. Output E from echo canceler 115 is supplied via equalizer 124 and gain unit 125 to the X input of echo canceler 114 and to a decoder input of CODEC 118. CODEC 118 converts the 8-bit $\mu$-law output E from echo canceler 115 into an analog signal, in well known fashion. The analog signal from CODEC 118 is supplied via hybrid 116 and transformer 101 to bidirectional 2-wire facility A.

In this example, equalizers 119 and 124 each include an eighth order finite impulse response filter of a type known in the art.

Figure 2:
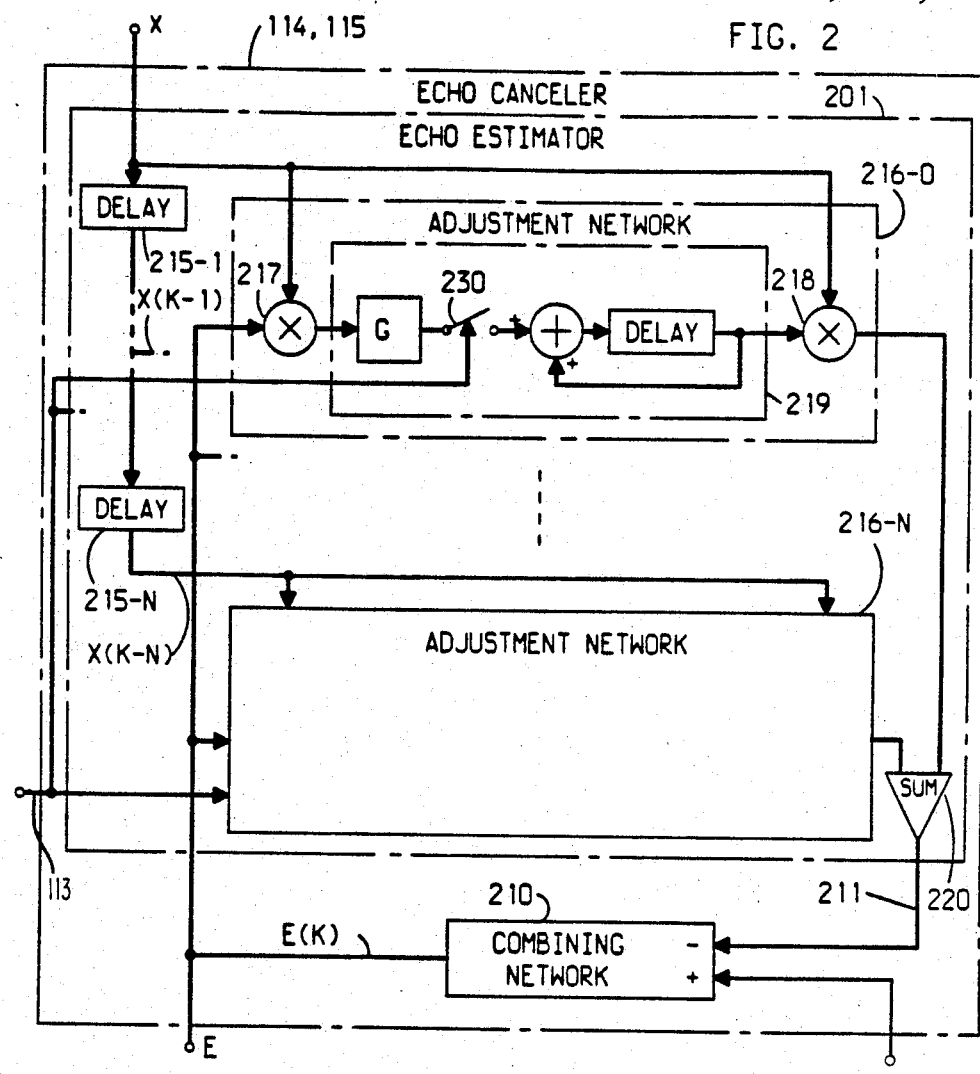
FIG. 2 depicts in simplified form details of the echo cancelers used in the repeater of FIG. 1.

FIG. 2 shows in simplified block diagram form details of an echo canceler which may be advantageously employed for echo cancelers 114 and 115. Echo canceler 114, 115 is broadly similar to echo cancelers disclosed in U.S. Pat. Nos. 3,499,999 and 3,500,000. Also see an article entitled "Bell's Echo-Killer Chip", *IEEE Spectrum*, October 1980, pages 34-37. In this embodiment echo canceler 114, 115 also includes an arrangement for inhibiting updating of an adaptive filter which generates an echo signal estimate in response to an output from detector 106 (FIG. 1) when large input signals are detected on either of 2-wire facilities A or B. This inhibits the echo canceler adaptive filter from adapting, in response to the large amplitude frequency components of the large input signal, to an impulse response which is undesirable for the normal level voice frequency input signals, i.e., speech and white noise.

Briefly, canceler 114, 115 includes an adjustable signal processor, i.e., adaptive filter having a closed loop error control system which is self-adapting in that it automatically tracks signal variation in an outgoing path. More specifically, canceler 114, 115 employs echo estimator 201 including an adaptive transversal filter arrangement for synthesizing a linear approximation of the echo, i.e., an echo estimate.

To this end, far end incoming signal X(K) is usually supplied from a far end talking party over a first transmission path, e.g., lead 202, to a first input of echo canceler 114, 115 and therein to an input of echo estimator 201. Far end signal X(K) may be, for example, a digitally sampled speech signal, where K is an integer identifying the sampling interval. However, because of an impedance mismatch, for example, in hybrid 122 (FIG.1), a portion of the hybrid input signal is reflected to the far end signal source as an echo. The echo is supplied from an output of hybrid 122 or 116 to the Y input of canceler 115 or 114, respectively, and therein to a first input of combining network 210. A second input to combining network 210 is a signal estimate of the echo generated by echo estimator 201. The echo estimate is supplied via lead 211 from an output of echo estimator 201 to the second input of combining network 210. Combining network 210 generates error signal E(K) corresponding to the algebraic difference between the echo estimate and the Y input to the echo canceler including the undesirable echo. Error signal E(K) is supplied to CODEC 121, 118 (FIG. 1) and to adjustment networks 216-O through 216-N in estimator 201.

Estimator 201 includes a so-called tapped delay line comprised of delay units 215-1 through 215-N for realizing desired delays at the taps corresponding to convenient Nyquist intervals. Therefore, delayed replicas X(K-1) through X(K-N) of incoming far end signal X(K) are generated at the corresponding taps. The signal at each tap position, namely X(K-1) through X(K-N) as well as X(K), is adjusted in response to error signal E(K). More particularly, signals X(K) through X(K-N) are individually weighted in response to E(K) via a corresponding one of adjustment networks 216-O through 216-N, respectively. Adjustment networks 216-O through 216-N each include multipliers 217 and 218, and feedback circuit 219. Feedback circuit 219 adjusts the tap weight to a desired value in a manner which will be apparent to those skilled in the art and explained in the above-noted references. Feedback circuit 219 includes an arrangement, symbolized by switch 230, for controllably inhibiting updating of the tap weight in response to a control signal from detector 106, in accordance with an aspect of the invention, when large amplitude signals are incoming to the repeater. That is to say, when switch 230 in each of adjustment networks 216 is open circuited the weighted replicas do not change in value. Consequently, when a true control signal from detector 106 is supplied to the echo cancelers all of adjustment networks 216 are inhibited and none of the weighted replicas change in value. The weighted replicas of X(K) from adjustment networks 216-O through 216-N are summed via summing network 220 to generate the echo estimate signal approximating the echo to be cancelled. The echo estimate is supplied via lead 211 to the second input of combining network 210. In this embodiment, the number (N) of taps in echo cancelers 114 and 115 is 24.

Figure 3:
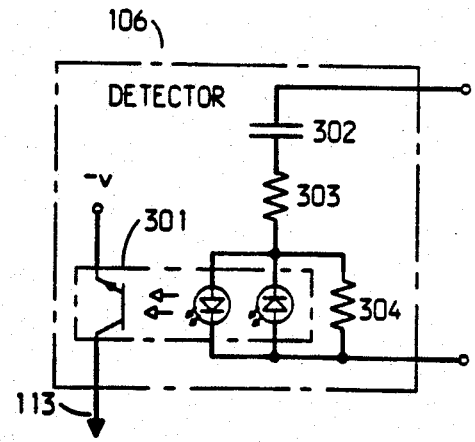
FIG. 3 shows details of the detector employed in FIG. 1.

FIG. 3 shows details of detector 106 which is employed, in accordance with an aspect of the invention, to detect the presence of a "large" out-of-band signal input to the repeater either from 2-wire facility A or 2-wire facility B. Detector 106 includes optical isolator 301 which is of the bidirectional type. Signals developed across either capacitor 105 or capacitor 109 (FIG. 1) are coupled via capacitor 302 to a voltage divider made up of resistors 303 and 304. The values of resistors 303 and 304 are selected to establish a predetermined voltage threshold for activating the light emitting diodes of optical isolator 301. As indicated above and not to be construed as limiting the scope of the invention, the threshold in this example is approximately 20 volts peak. Thus, when a signal having a peak amplitude of 20 volts or greater is developed across either capacitor 105 or capacitor 109 (FIG. 1), the phototransistor of optical isolator 301 is turned on and the potential $-V$ is supplied via circuit path 113 (FIG. 1) to both of echo cancelers 114 and 115. The potential $-V$ is representative of a logical 1 or a true logical signal. Since detector 106 is an amplitude detector any large signal having sufficient amplitude to exceed the predetermined threshold would obviously not be a "normal" voice frequency signal and will cause generation of the control signal to inhibit updating of the echo canceler impulse response characteristic.

Although the present invention has been described in simplified block diagram form, a preferred embodiment is realized by appropriately programming a digital signal processor to obtain the CODEC, equalizer, gain unit and echo canceler functions. One such digital signal processor unit is manufactured by AT&T Technologies, Inc. and is described in several articles in *The Bell System Technical Journal*, Vol. 60. No. 7, Part 2, dated Sept. 1981. A prior known repeater employing one such digital signal processor is broadly described in an article entitled, "Digital Signal Solves Hybrid Balance Puzzle", *Telephone Engineer & Management*, Aug. 1, 1983, pages 39–46.

What is claimed is:

1. A signal transmission network including:
   at least first means adapted to connect said transmission network to at least a first bidirectional transmission facility;
   at least first echo canceler means for cancelling echo signals resulting in said transmission network because of said first bidirectional transmission facility, said echo canceler means including signal processor means adapted to be supplied with an input signal and being responsive to an error signal for generating an estimate of an echo signal to be cancelled by adjusting an impulse response characteristic, means responsive to a control signal for inhibiting adjusting said impulse response characteristic and means for algebraically combining said echo signal estimate with an outgoing signal to generate said error signal; and
   amplitude detecting means including an optical isolator responsive to signal incoming to said transmission network from said first bidirectional transmission facility for detecting large incoming signals having an amplitude equal to or greater than a predetermined threshold value and for generating said control signal to inhibit adjusting of said impulse response characteristic of said at least first echo canceler means during intervals that said large signals are detected incoming to said transmission network.

2. A bidirectional signal transmission network including:
   first means adapted for connecting said transmission network to a first bidirectional transmission facility,
   second means adapted for connecting said transmission network to a second bidirectional transmission facility;
   first echo canceler means for cancelling echo signals resulting in said transmission network because of said first bidirectional transmission facility;
   second echo canceler means for cancelling echo signals resulting in said transmission network because of said second bidirectional facility;
   each of said first and second echo canceler means including signal processing means adapted to be supplied with an input signal and being responsive to an error signal for generating an estimate of an echo signal to be cancelled by adjusting an impulse response characteristic, means responsive to a control signal for inhibiting adjusting said impulse response characteristic and means for algebraically combining said echo signal estimate with an outgoing signal to generate said error signal; and
   means responsive to signals incoming to said bidirectional transmission network from said first and second bidirectional transmission facilities for detecting large incoming signals and for generating said control signal to inhibit adjusting of said impulse response characteristic of said first and second echo canceler means during intervals that large signals are detected incoming to said bidirectional transmission network.

3. The invention as defined in claim 2 wherein said detecting means includes amplitude detector means.

4. The invention as defined in claim 3 wherein said amplitude detector means includes means for detecting incoming signals having an amplitude equal to or greater than a predetermined threshold value.

5. The invention as defined in claim 4 wherein said amplitude detector means detects the peak amplitude of said incoming signals.

6. The invention as defined in claim 5 wherein said detector means includes an optical isolator.

7. The invention as defined in claim 2 wherein said first and second means each includes a transformer having a primary winding including a midpoint capacitor, said primary winding of said first means transformer being adapted to be connected to said first bidirectional transmission facility and said primary winding of said second means transformer being adapted to be connected to said second bidirectional transmission facility, and wherein said detecting means is connected to detect signals developed across said midpoint capacitors.

8. The invention as defined in claim 7 wherein said detecting means comprises amplitude detecting means for generating said control signal when incoming signals to said bidirectional transmission network develop a signal across either of said midpoint capacitors which is equal to or greater than a predetermined threshold value.

9. The invention as defined in claim 7 wherein said detecting means comprises amplitude detecting means for generating said control signal when signals incoming to said transmission network develop a signal across either of said midpoint capacitors having an amplitude greater than a predetermined threshold value.

10. The invention as defined in claim 9 wherein said detecting means includes an optical isolator.

11. A signal transmission network including:

at least first means adapted to connect said transmission network to at least a first bidirectional transmission facility, said at least first means including a transformer having a primary winding including a midpoint capacitor, said primary winding being adapted to be connected to said at least first bidirectional transmission facility, at least first echo canceler means for cancelling echo signals resulting in said transmission network because of said first bidirectional transmission facility, said echo canceler means including signal processor means adapted to be supplied with an input signal and being responsive to an error signal for generating an estimate of an echo signal to be cancelled by adjusting an impulse response characteristic, means responsive to a control signal for inhibiting adjusting said impulse response characteristic and means for algebraically combining said echo signal estimate with an outgoing signal to generate said error signal; and means connected across said midpoint capacitor and being responsive to signals incoming to said transmission network from said first bidirectional transmission facility for detecting large incoming signals developed across said midpoint capacitor and for generating said control signal to inhibit adjusting of said impulse response characteristic of said at least first echo canceler means during intervals that large signals are detected incoming to said transmission network.

12. The invention as defined in claim 11 wherein said detecting means comprises amplitude detecting means for generating said control signal when incoming signals developed across said midpoint capacitor means are equal to or greater than a predetermined threshold.

* * * * *